United States Patent [19]

Corey

[11] 4,305,767
[45] Dec. 15, 1981

[54] LABEL SYSTEM FOR MAKING INTEGRATED CIRCUIT DIAGRAMS AND PRINTED CIRCUIT BOARDS

[76] Inventor: Jan M. Corey, 39 West 6th Avenue, Mesa, Ariz. 85202

[21] Appl. No.: 179,510

[22] Filed: Aug. 19, 1980

Related U.S. Application Data

[62] Division of Ser. No. 18,148, Mar. 7, 1979, Pat. No. 4,244,125.

[51] Int. Cl.³ ............................................. B32B 31/00
[52] U.S. Cl. ........................................ 156/62; 156/63; 156/249; 156/300; 156/DIG. 19
[58] Field of Search .................. 156/62, 63, 249, 300, 156/DIG. 19

[56] References Cited

U.S. PATENT DOCUMENTS 3,460,281  8/1969  Levy ...................................... 40/2 R
3,769,895  11/1973  Lucas ................................... 354/292

Primary Examiner—James J. Bell
Attorney, Agent, or Firm—Cahill, Sutton & Thomas

[57] ABSTRACT

Gummed labels having outlines corresponding to top and bottom views of integrated circuit packages include numbered lead locations as seen from both the top and bottom of a particular integrated circuit package. A simplified schematic diagram located on the portion of a label corresponding to the integrated circuit package body indicates connection of an integrated circuit to the respective leads. Part numbers and brief descriptions and commercial integrated circuits are printed on the labels. A plurality of unused labels are removably attached to a backing sheet, and are peeled off and placed on a working sheet to enable an engineer or technician to easily make diagrams or printed circuit board layouts without having to refer to a manufacturer's catalog.

4 Claims, 6 Drawing Figures

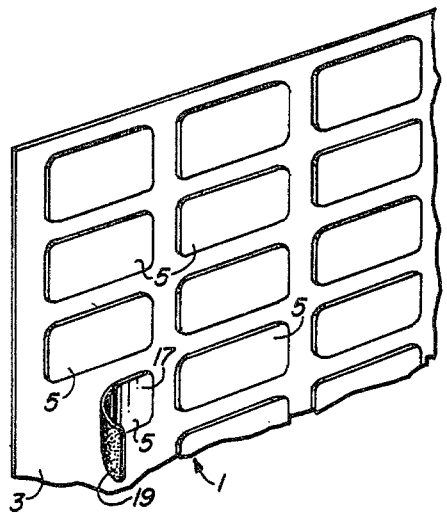
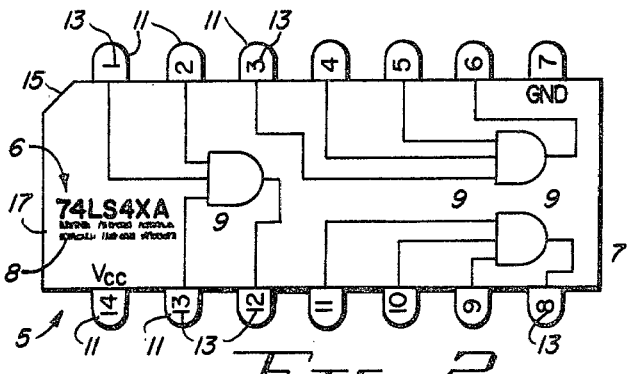
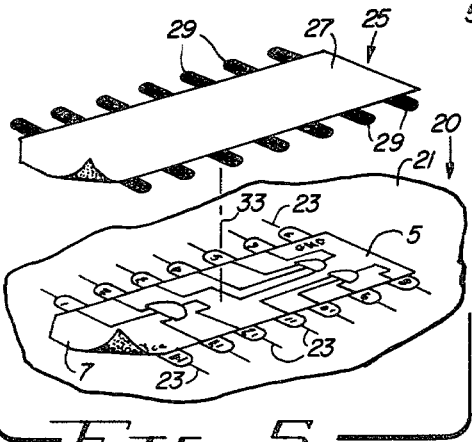
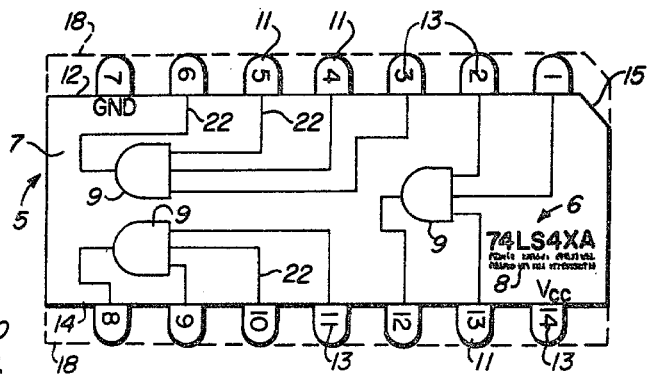
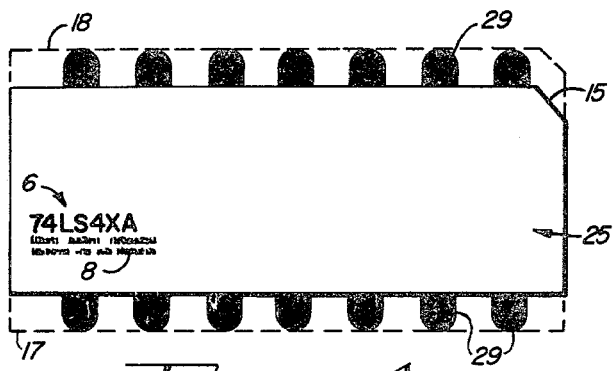
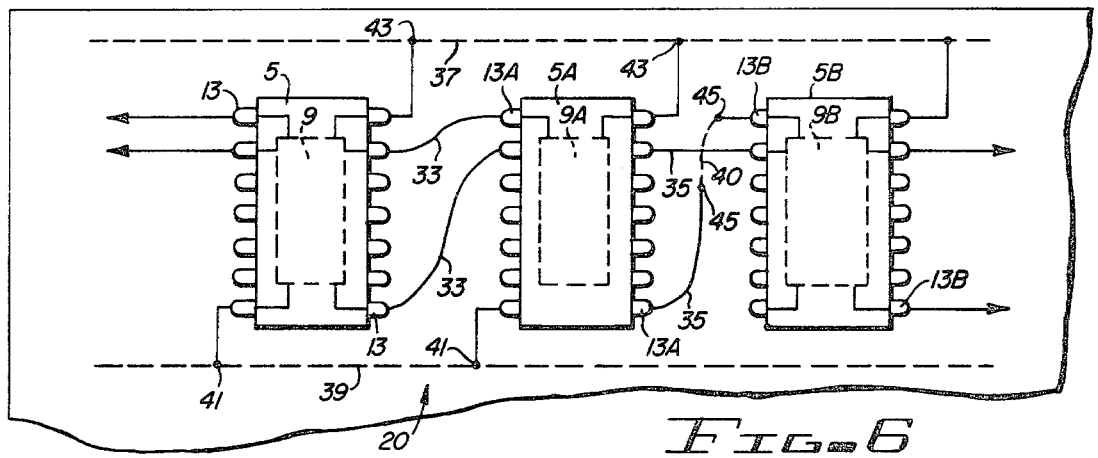

LABEL SYSTEM FOR MAKING INTEGRATED CIRCUIT DIAGRAMS AND PRINTED CIRCUIT BOARDS

This is a division of application Ser. No. 018,148, filed Mar. 7, 1979 now U.S. Pat. No. 4,144,115.

BACKGROUND OF THE INVENTION

1. Field of the Invention

The invention relates to label assemblies and methods of using labels, and more particularly, to labels indicating top view or bottom view lead locations for integrated circuit packages and methods of utilizing such label assemblies to enable one to conveniently create electronic system schematic drawings and corresponding printed circuit boards.

2. Description of the Prior Art

Integrated circuits are now widely utilized in electronic systems to perform a wide variety of linear and digital circuit functions. Integrated circuits are commonly housed in dual-in-line packages (DIP) having from a few to a large number of lead connectors aligned along opposed edges of the dual-in-line packages. An electronic system is ordinarily implemented by mounting a number of integrated circuits on printed circuit boards. In order to design an electronic system using integrated circuit packages, an engineer may prepare a system block diagram by means of blocks which represent the various integrated circuit components of the electronic system and by means of interconnecting lines which represent various conductors which connect the various leads of the integrated circuits to provide an operable system. The electronic system is usually initially built in the form of a prototype system wherein sockets having line pins (referred to as "wire-wrap" pins) extending from the bottoms of the sockets are mounted on a card or chassis; conductors are "wire-wrapped" to such pins by means of "wire-wrap" tools which are well known in the art. After all of the necessary interconnecting conductors are wire-wrapped to the proper pins, the various integrated circuits are then inserted into their corresponsing sockets to test the operation of the prototype and make modifications thereto if necessary.

Although skilled electrical engineers and technicians are usually generally familiar with the operation and capabilities of various integrated circuits which are commonly used in their particular area of the electronic art, they don't ordinarily recall precisely which integrated circuit package leads are to be connected to the various data, power supply, or control inputs and outputs of each integrated circuit. In order to make diagrams which are useful to enable technicians or operators to fabricate the above mentioned prototypes, it is necessary for the engineers to spend a great deal of time "looking up" each integrated circuit utilized in the system in manufacturers' catalogs to determine the functions of the integrated circuit package leads. Manufacturers' catalogs ordinarily show the integrated circuit package lead configuration only with reference to a top view of the integrated circuit package. However, wire-wrapping operations for providing the necessary connections between integrated circuit units are ordinarily made by a technician by looking at the bottoms of each integrated circuit socket. In order to determine which wire-wrap pin a particular conductor must be connected to, the technician must mentally "reverse" the top view of the lead connections for the particular integrated circuit to envision the "bottom view" location and lead number of the corresponding integrated circuit. This mental reversal leads to frequent interconnection errors by technicians during fabrication of prototypes of electronic systems. Consequently, considerable time is lost in locating and correcting such interconnection errors.

Accordingly, it is an object of the invention to provide a convenient label assembly which provides labels to indicate lead locations for commercially available integrated circuits to facilitate making of block diagrams of electronic systems incorporating the integrated circuits.

Another object of the invention is to provide a system which enables engineers to prepare block diagrams of electronic systems utilizing integrated circuits without having to refer to manufacturers' integrated circuit catalogs to determine integrated circuit lead locations.

Still another object of the invention is to provide a system for facilitating assembly of electronic systems utilizing electronic circuits while minimizing interconnection errors due to mental reversal of top view lead location diagrams of integrated circuit packages.

When a prototype of an electronic system has been sufficiently tested and modified to ensure an economical, reliable product, printed circuit boards then are prepared, wherein metal conductors disposed on an insulating "board" or card are routed to provide the various interconnections required between leads of various integrated circuits. The patterns on printed circuit boards are commonly provided by use of photographic "negatives" in conjunction with photographic processes which enables the desired metal interconnection patterns to be provided by well known etching processes. The artwork from which the photographic negatives are produced is commonly laid out or drawn by hand. Sometimes paste-on "blocks" and gummed tape of predetermined width are utilized to designate integrated circuits and strips of metal interconnecting various points on the printed circuit card. The artwork is then photographed to produce the above mentioned negatives. Frequent reference to the above mentioned manufacturers' catalogs to determine lead locations is required to make such schematic block diagrams, and requires a great deal of painstaking artwork by artists skilled in this area. The cost of printed circuit board artwork is therefore quite expensive. There is an unmet need for a lower cost means of making printed circuit board artwork.

Accordingly, it is an object of the invention to provide a system for making printed circuit board artwork directly from engineering drawings.

A novelty search directed to the invention of the present application uncovered U.S. Pat. Nos. 2,213,666, 3,460,281, 3,769,895 and 2,049,867, which disclose various labels, none of which solve the above mentioned problems of the prior art.

SUMMARY OF THE INVENTION

Briefly described, and in accordance with one embodiment thereof, the invention provides a label system and method for conveniently making diagrams for integrated circuit systems and for making printed circuit board artwork directly from such diagrams.

The label system includes a plurality of labels each having an outline corresponding to the outline of a commercially available integrated circuit package.

Semiconductor package lead locations are designated by lead numbers along the respective sides of the label representing the edges of the corresponding semiconductor package. A rectangular area of the label representing the body of the semiconductor package has printed thereon information identifying the integrated circuit part number, both by description and manufacturer's part number. A brief schematic or verbal indication of the functions of various leads of the specified integrated circuit package are indicated on the face of the label. Both "top view" and "bottom view" arrangements of the semiconductor package lead locations are provided on separate labels.

The gummed surface of each label is used to removably attach the label on a waxed paper backing sheet. A catalog of such labels can be maintained in loose leaf form, whereby an engineer can quickly obtain labels for the particular integrated circuits which are utilized to implement an electronic system being designed. The engineer utilizes bottom view labels by sticking them onto a work sheet and drawing interconnecting lines between the indicated leads of the various integrated circuits included in the system being designed. This greatly facilitates making of useful engineering drawings of the electronic system without the necessity of looking up each integrated circuit in a manufacturer's catalog to determine the lead functions. A technician then easily can use the engineering drawing as a guide for making wire-wrap connections or other type of connections without having to perform a mental reversal of the top view of the pin locations as indicated in most integrated circuit manufacturer's catalogs.

In accordance with one embodiment of the invention, mask labels for each type of semiconductor package are provided on a waxed paper backing sheet, as described above. However, the masking labels are white, except for black, rounded lead tabs, which extend from the sides of the label corresponding to edges of a semiconductor package. After the above mentioned engineering drawings have been completed, the masking labels can be superimposed upon the lead number identifying labels. If the interconnecting lines made between leads of the respective integrated circuits indicated on the work sheet are made of sufficient width and darkness, the work sheet then can be photographed to produce a negative which can be utilized to etch the desired landing pad and interconnection pattern on a side of a printed circuit board.

BRIEF DESCRIPTION OF THE DRAWINGS

FIG. 1 is a partial view of a label assembly of the present invention.

FIG. 2 is a top view label of a particular integrated circuit.

FIG. 3 is a bottom view label of the same integrated circuit.

FIG. 4 is a masking label corresponding to the label of FIG. 3 for use in making printed circuit board artwork.

FIG. 5 is a perspective diagram useful in illustrating use of the masking label of FIG. 4.

FIG. 6 is a schematic representation of part of a drawing indicating use of a plurality of the labels of the invention to make an engineering drawing.

DESCRIPTION OF THE INVENTION

Referring now to the drawings, and particularly to FIGS. 1-3, label assembly 1 includes a plurality of gummed labels 5 which are adhesively attached to a backing sheet 3. Each of gummed labels 5 includes a white upper surface 17 and a lower gummed surface 19, such that each gummed label 5 can be easily peeled away from backing sheet 3 and attached to a work sheet, subsequently described. Backing sheet 3 can be any suitable paper, such as waxed paper, to which the adhesive on surface 19 can removably be attached.

FIG. 3 shows an individual label 5 which has printed thereon a logic diagram of the integrated circuit components contained in a particular commercially available integrated circuit. More particularly, logic components 9 are printed upon the rectangular section 7 of label 5.

A plurality of lead tabs 11 extend from and are uniformly spaced along edges 12 and 14 of rectangular section 7 of label 5. Each of the rectangular tabs 11 has a numeral 13 printed thereon. In FIG. 3, the numerals correspond to integrated circuit package lead numbers as seen from the bottom of the commercially available integrated circuit represented by the schematic symbols 9 printed on rectangular section 7 of label 5. Thus, in an engineering diagram made from a plurality of labels, such as label 5, in the manner subsequently described, a technician interconnecting or "wire-wrapping" sockets into which integrated circuits are subsequently inserted can readily determine which pin of a socket corresponds to which input of the corresponding integrated circuit. The technician readily can make the necessary connections to implement a prototype system from such a diagram without having to refer to manufacturers' catalogs to determine integrated circuit package lead functions and locations. The need to perform a mental reversal of the top view normally shown in manufacturers' catalogs is eliminated, and the resulting errors are also eliminated.

It should be noted that lead tabs 11 can extend beyond edges 12 and 14, as shown by the solid lines in FIG. 3. Tabs 13 can simply be printed on extensions of rectangular section 7, which extensions are indicated by dotted lines 18 in FIG. 3.

The manufacturer's part number for the integrated circuit represented by the logic elements 9 is printed in rectangular section 7, as indicated by reference numeral 6. A brief descriptive name of the integrated circuit (for example, "hex inverter," "quad NAND," "8 bit microprocessor," etc.) is also printed in rectangular section 7, as indicated by reference numeral 8.

The connections of each lead 11 to circuitry 9 is indicated by printed lines, such as 22 in FIG. 3. Alternatively, words or abbreviations can be utilized to indicate the functions of particular leads. For example, in FIG. 3, the term "GND" indicated that the function of lead 7 is to conduct the system ground voltage, and the letters $V_{CC}$ indicate that lead 14 conducts the positive power supply voltage.

A plurality of label assemblies, such as 3, in FIG. 1, can be stored in a loose leaf notebook. An engineer can keep a supply of label assemblies 1 for each of the integrated circuits he commonly uses. The notebook can be conveniently indexed to enable the engineer to obtain a suitable label much more rapidly than he could locate the lead diagram in most manufacturers' integrated circuit catalogs. He then merely peels suitable labels from the respective backing sheets 3, and pastes them on a work sheet 20, as shown in FIG. 6 in a location which leaves a sufficient amount of room to draw connections from the various lead locations 11 of one integrated circuit to suitable lead locations of another label representing another integrated circuit.

Referring now to FIG. 6, work sheet 20, which, when completed, is a detailed block diagram of an electronic system, includes a plurality of gummed labels of the type described above, including labels 5, 5A and 5B, having their adhesive faces attached to work sheet 20. Work sheet 20 shows the details of conductors connecting the various lead tab locations of the respective integrated circuit lead labels to other lead tab locations. For example, lines 33 can be drawn between lead tabs of 13A of integrated circuit lead labels 5 and 5A with a broad felt tip pen. Similarly, lines 35 are drawn between lead tab locations 13A and 13B of integrated circuit lead labels 5A and 5B, as shown in FIG. 6B. As subsequently explained, interconnecting lines such as 33 and 35 can be drawn sufficiently wide and of sufficient darkness to permit the completed work sheet 20 to be photographed and utilized to make a negative film which in turn can be used in manufacture of a printed circuit board for the electronic system represented by the diagram on working sheet 20.

The diagram on work sheet 20 indicates location of conductive strips on both upper and lower surfaces of a printed circuit board on which the circuit represented by the diagram can be implemented. The dotted lines, such as 37, 39 and 40 in FIG. 6 represent conductors disposed on the undersurface of a printed circuit board. Reference numerals 41, 43 and 45 represent "vias," which are conductors which extend through holes drilled in the printed circuit board to electrically connect strip conductors on the underside of the printed circuit board to conductors on the top surface thereof.

Work sheet 20, when completed, can be utilized as an easily made yet thorough logic diagram or block diagram of the electronic system to be implemented, and can also be used to make "negatives" which are utilized in the process of making printed circuit boards. If the size and shape of the lead integrated circuit lead labels 5 are drawn to a precise scale with respect to the actual package lead locations, corresponding masking labels, such as masking labels 25 of FIGS. 4 and 5 can be aligned with and attached to cover the printed matter on integrated circuit lead labels 5, 5A, 5B, etc. in FIG. 6; the resulting outline on work sheet 20 can be photographed to produce the above mentioned printed circuit board negative.

Referring now to FIGS. 4 and 5, mask label 25 has a white major surface 7 which will not show up on the film when the diagram on work sheet 20 is photographed. However, the manufacturer's part number and brief description, as indicated by reference numerals 6 and 8, can be retained if desired.

In masking label 25, lead tabs 29, sometimes referred to as "landing pads," are completely darkened with a color which shows up distinctly on the film when the above mentioned photograph of work sheet 20 is taken.

The drawing of FIG. 5 illustrates how mask label 25 is aligned with (as indicated by reference numeral 31) and placed downward so that its adhesive lower surface sticks to the upper surface of integrated circuit lead label 5, thereby covering all of the printed matter on rectangular section 7. When masking labels are similarly placed over all of the integrated circuit lead labels on work sheet 20, a photograph of work sheet 20 produces an image on the film which can be utilized (after an appropriate photographic reduction, if necessary) to make a printed circuit board without the necessity of providing hand drawn artwork for the printed circuit layout. A considerable savings in making printed circuit boards is thereby effected.

While the invention has been described with reference to a particular embodiment thereof, those skilled in the art can make various modifications to the described label system and method of using it without departing from the true spirit and scope of the invention. For example, the scale to which the integrated circuit lead labels are drawn can be any suitable scale factor, although a scale factor of twice the actual integrated circuit package size is usually suitable for making block diagrams of an electronic circuit system. In some cases, a logic diagram illustrating the top view of the lead connections of the integrated circuits utilized is desirable. In this case, top view lead diagrams such as the one shown in FIG. 2 can be utilized.

I claim

1. A method of making a schematic block diagram of an electronic system including a plurality of integrated circuits, said method comprising the steps of:
   a. removing a plurality of gummed labels from a backing sheet, said gummed labels each having an upper surface, said upper surface having a plurality of numbered lead tab areas thereof, said lead tab areas being numbered in respective sequences in accordance with the sequences of leads as viewed from the bottom sides of each of a plurality of respective integrated circuit packages;
   b. attaching said gummed labels to a sheet on which the schematic block diagram is to be made; and
   c. drawing a plurality of lines connecting predetermined ones of said lead tab areas on said sheet, said lines representing electrical conductors of the electronic system.

2. The method of claim 1 wherein said lines are sufficiently dark and of sufficient width to clearly produce corresponding lines of a printed circuit board made using film in a camera photographing said schematic block diagram.

3. The method of claim 2 further including superimposing a plurality of masking labels on said integrated circuit lead labels, respectively, each of said masking labels including a plurality of darkened lead tab areas which cover said numbered lead tab areas of said respective integrated circuit lead labels, said masking labels each also having a blank area which covers the schematic information on said respective integrated circuit lead labels.

4. The method of claim 3 further including photographing said schematic block diagram to make a film negative for use in manufacturing a printed circuit board for said electronic circuit.

* * * * *